United States Patent
Wu et al.

(10) Patent No.: US 8,487,727 B2
(45) Date of Patent: Jul. 16, 2013

(54) MAGNET ASSEMBLIES AND METHODS FOR MAKING THE SAME

(75) Inventors: Anbo Wu, Shanghai (CN); Yan Zhao, Shanghai (CN); Chao Yang, Shanghai (CN); Evangelos Trifon Laskaris, Schenectady, NY (US); Xianrui Huang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 4 days.

(21) Appl. No.: 13/218,517

(22) Filed: Aug. 26, 2011

(65) Prior Publication Data

US 2012/0068795 A1   Mar. 22, 2012

(30) Foreign Application Priority Data

Sep. 17, 2010   (CN) .......................... 2010 1 0289866

(51) Int. Cl.
*H01F 1/00* (2006.01)
*H01F 6/00* (2006.01)

(52) U.S. Cl.
USPC .............................. 335/216; 335/296; 324/318

(58) Field of Classification Search
USPC .................... 335/216, 296–299; 324/300–322
See application file for complete search history.

(56) References Cited

U.S. PATENT DOCUMENTS

| | | | |
|---|---|---|---|
| 3,638,154 A * | 1/1972 | Sampson et al. | ............. 335/216 |
| 5,225,782 A | 7/1993 | Laskaris et al. | |
| 5,243,286 A * | 9/1993 | Rzedzian et al. | ............. 324/318 |
| 5,317,297 A | 5/1994 | Kaufman et al. | |
| 5,572,129 A * | 11/1996 | Carlson | ......................... 324/318 |
| 6,456,076 B1 | 9/2002 | Joseph et al. | |
| 6,783,059 B2 | 8/2004 | Laskaris et al. | |
| 6,995,562 B2 | 2/2006 | Laskaris et al. | |
| 7,053,740 B1 | 5/2006 | Laskaris et al. | |
| 7,518,370 B2 | 4/2009 | Huang et al. | |

FOREIGN PATENT DOCUMENTS

EP   1728087 B1   12/2006

* cited by examiner

*Primary Examiner* — Bernard Rojas
(74) *Attorney, Agent, or Firm* — Global Patent Operation (57) ABSTRACT

A superconducting magnet assembly is provided. The superconducting magnet assembly includes a superconducting magnet configured to generate a static magnetic field, an iron shield configured to shield the superconducting magnet, and a magnetic gradient coil assembly configured to generate a gradient magnetic field. The superconducting magnet assembly further includes one or more magnetic lamination elements disposed on the iron shield to reduce eddy current induced by the gradient magnetic field in the iron shield. A method is also presented.

13 Claims, 4 Drawing Sheets

MAGNET ASSEMBLIES AND METHODS FOR MAKING THE SAME

CROSS-REFERENCE TO RELATED APPLICATIONS

This application claims the right of priority under 35 U.S.C. §119(a)-(d) to the earlier filing date of co-pending Chinese Patent Application No. 201010289866.0, filed Sep. 17, 2010, the disclosure of which is herein incorporated in its entirety. The basis for this claim of priority is the Paris Convention for the Protection of Industrial Property and by virtue of China's membership in the World Trade Organization.

BACKGROUND

This disclosure relates generally to magnet assemblies and methods for making the same. More particularly, this disclosure relates to low eddy current superconducting magnet assemblies and methods for making the same used in such application as for Magnetic Resonance Imaging (MRI) systems, as well as security and inspection technologies.

MRI systems are widely used in medical community for imaging items such as tissue and bone structures. In current applications, some MRI systems employ superconducting magnets to generate strong, uniform magnetic fields within which patients or other subjects are placed. Magnetic gradient coils and other elements such as radio frequency coils are also employed to cooperate with the superconducting magnets to produce desired images.

In such MRI systems, superconducting magnets are generally magnetically shielded to prevent the magnetic fields created by such magnets from adversely interacting with electronic equipments located near the superconducting magnets, some of which may adversely affect the imaging quality. Techniques for magnetically shielding such magnets include active and/or passive shielding.

Passively shielded superconducting magnets are employed in some applications since passive shielding is typically more cost-effective than active shielding. Passive shielding generally employs iron shields (iron yokes) for shielding of the superconducting magnets. However, in such MRI systems, magnetic gradient coils produce gradient magnetic fields so as to induce undesirable eddy current in the iron shields, which are disadvantageous to the quality of images retrieved by such MRI systems.

Therefore, there is a need for new and improved superconducting magnet assemblies and methods for making the same to reduce eddy current in Magnetic Resonance Imaging systems.

BRIEF DESCRIPTION

A superconducting magnet assembly is provided in accordance with one embodiment of the system. The superconducting magnet assembly comprises a superconducting magnet configured to generate a static magnetic field, an iron shield configured to shield the superconducting magnet, and a magnetic gradient coil assembly configured to generate a gradient magnetic field. The superconducting magnet assembly further comprises one or more magnetic lamination elements disposed on the iron shield to reduce eddy current induced by the gradient magnetic field in the iron shield.

A superconducting magnet assembly is provided in accordance with another embodiment of the system and comprises a superconducting magnet configured to generate a static magnetic field, an iron shield configured to shield the superconducting magnet, and a magnetic gradient coil assembly configured to generate a gradient magnetic field. The superconducting magnet assembly further comprises a plurality of magnetic lamination elements disposed on the iron shield and one or more non-magnetic gaps defined between adjacent magnetic lamination elements along a direction of the static magnetic field generated by the superconducting magnet.

An embodiment further provides a method for making a superconducting magnet configured to generate a static magnetic field, providing an iron shield configured to shield the superconducting magnet, providing a magnetic gradient coil assembly configured to generate a gradient magnetic field, and providing one or more magnetic lamination elements disposed on the iron shield to reduce eddy current induced by the gradient magnetic field in the iron shield.

BRIEF DESCRIPTION OF THE DRAWINGS

The above and other aspects, features, and advantages of the present disclosure will become more apparent in light of the subsequent detailed description when taken in conjunction with the accompanying drawings in which.

DETAILED DESCRIPTION

Embodiments of the present disclosure are described herein with reference to the accompanying drawings. In the subsequent description, well-known functions or constructions are not described in detail to avoid obscuring the disclosure in unnecessary detail.

Figure 1:
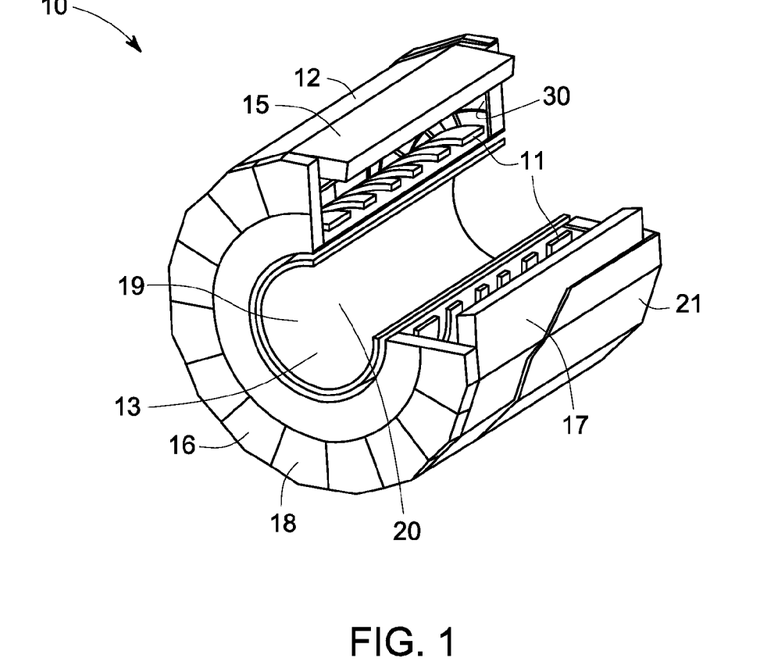
FIG. 1 is a schematic perspective diagram of a superconducting magnet assembly of a MRI magnet in accordance with one embodiment of the system.

FIG. 1 is a schematic diagram of a superconducting magnet assembly 10 of a Magnetic Resonance imaging (MRI) system in accordance with one embodiment of the invention. As illustrated, in FIG. 1, the superconducting magnet assembly 10 comprises a superconducting magnet 11, an iron shield 12, a magnetic gradient coil assembly 13, and magnetic lamination elements 14 and 30 (show in FIG. 2).

In embodiments of the system, the superconducting magnet 11 may function as a magnet source to generate a magnetic field, such as a main static magnetic field. The iron shield 12, which is also referred to as an iron yoke, may encase the superconducting magnet 11 and functions as a passive shield to capture and contain the magnetic field generated by the superconducting magnet 11 within the iron shield 12 in order to prevent the magnetic field from adversely interacting with electronic equipments located near the superconducting magnet 11 or otherwise interfering with the MRI operation.

For some arrangements, the superconducting magnet 11 may comprise a superconducting coil assembly and defines a central bore (not labeled) passing through the superconducting coil magnet. In some applications, the superconducting coil assembly may comprise one or more superconducting solenoid winding coils. Non-limiting examples of superconducting materials of the superconducting magnet 11 may include niobium-titanium (NbTi), niobium-tin ($Nb_3Sn$) and magnesium boride ($MgB_2$) wires, and BiSrCaCuO (BSCCO) and $YBa_2Cu_3O_7$ (YBCO).

The iron shield 12 may comprise one or more magnetic materials. Non-limiting examples of the one or more magnetic materials of the iron shield 12 may include ferrites, steels, magnetic alloys, other suitable magnetic materials, and combinations thereof.

For the illustrated arrangement in FIG. 1, the iron shield 12 has an elongated cylindrical shape, and comprises a body 15 and two end portions (flanges) 16 disposed on opposite ends of the body 15 so as to define a chamber (not labeled) for accommodating the superconducting magnet 11. In non-limiting examples, the body 15 may be formed with a plurality of body elements 17, such as a plurality of separated electrically insulated plates or sections, and forms a polygonic shape. The flanges 16 may also be formed with a plurality of flange elements 18 such as separated electrically insulated plates or sections, and has a polygonic circular shape.

Alternatively, the body 15 and/or the flanges 16 may have other configurations. For example, the body 15 may be formed unitarily and have a cylindrical shape. Each of the flanges 16 may also be formed unitarily and have a ring shape.

In some examples, the iron shield 12 may be coaxial with the superconducting coil 11. Each of the flanges 16 may define an opening 19 to communicate with the central bore of the superconducting magnet 11, for example, to receive an object to be scanned in MRI applications.

In some embodiments, the magnetic gradient coil assembly 13 may comprise one or more magnetic gradient coils and be configured to supply a linear gradient magnetic field to MRI signals to realize spatial positioning, phase encoding and frequency encoding so as to facilitate production of images with high quality. In one non-limiting example, the magnetic gradient coil assembly 13 generates an alternating current (AC) gradient magnetic field. In the illustrated example, the magnetic gradient coil assembly 13 passes through the central bore of the superconducting coil 11 and defines a through hole 20 space-overlapped with the central bore for receiving the object to be scanned.

During operation, the magnetic gradient coil assembly 13 may produce gradient magnetic fields so as to induce undesirable eddy current in the iron shield 12. In order to reducing the undesirable eddy current induced in the iron shield 12, as illustrated in FIGS. 1 and 2, the magnetic lamination elements 14 and 30 may be disposed on the body 15 and the flanges 16 of the iron shield 12 respectively for reducing the eddy current induced by the magnetic gradient coil assembly 13 in the iron shield 12.

It should be noted that the arrangement shown in FIG. 1 is merely illustrative. In some embodiments, the superconducting magnet assembly 10 may further comprise other elements including, but not limited to radio frequency coils and a refrigerating element, such as a thermal shield, a cryostat or a container containing liquid, helium for refrigerating the superconducting magnet 11. For easy clarification, other elements, such as the radio frequency coils, the thermal shield and the refrigerating element are not illustrated.

As depicted in FIG. 1, in certain applications, the superconducting magnet assembly 10 may further comprise a vacuum vessel 21 encasing the iron shield 12 and a part of the vacuum vessel 21 may be located between the iron shield 12 and the magnetic gradient coil assembly 13 so as to accommodate the superconducting magnet 11, the iron shield 12 and other elements such as the refrigerating element for thermal insulation between a cryogenic temperature environment and an ambient environment.

Figure 2:
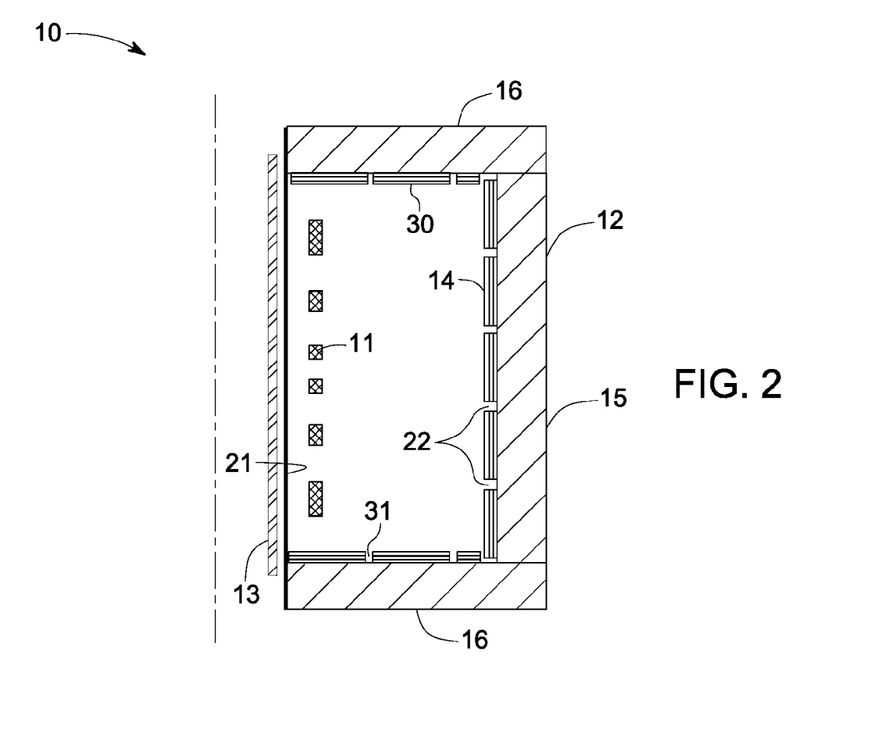
FIG. 2 is a schematic cross-section view of the superconducting magnet assembly in accordance with one embodiment of the system.

FIG. 2 illustrates a schematic cross-section view of the superconducting magnet assembly 10. As depicted in FIG. 2, the iron shield 12 receives the superconducting magnet 11 and is disposed around the magnetic gradient coil assembly 13. In one example, the magnetic gradient coil assembly 13 is not shielded. The vacuum vessel 21 encases the iron shield 12 and a part of the vacuum vessel 21 is located between the iron shield 12 and the magnetic gradient coil assembly 13.

For the illustrated arrangement in FIG. 2, a plurality of the magnetic lamination elements 14 and 30 are disposed on inner (interior) surfaces (not labeled) of the body 15 and the two flanges 16 of the iron shield 12 respectively to reduce the magnitude and time constant of the eddy current induced by the magnetic gradient coil assembly 13 in the iron shield 12. In other applications, the magnetic lamination elements may be disposed on at least one of the body 15 and the two flanges 16 of the iron shield 12. In non-limiting examples, the magnetic lamination elements 14 and 30 may be directly disposed on the iron shield. Alternatively, one or more adhesive materials, such as adhesive resin may be employed to couple the magnetic lamination elements 14 and 30 to the body 15 and the flanges 16 respectively.

In some examples, each of the magnetic lamination elements 14 and 30 may comprise two or more layers of one or more magnetic materials. Non-limiting examples of the magnetic materials of the magnetic lamination element may comprise silicon steel, amorphous magnetic materials, and/or other magnetic materials with anisotropic magnetic permeability and/or high electrical resistivity. In certain applications, the magnetic lamination element 14 and the magnetic lamination element 30 may have the same or different magnetic materials as well as differing size, shape and number of layers. In one non-limiting examples, the magnetic lamination element is made of magnetic tiles glued by insulated adhesives.

For some arrangements, each of the magnetic lamination elements 14 and 30 may define a laminating direction A (show in FIG. 3) along which the two or more layers of the one or more magnetic materials are laminated. Furthermore, the magnetic lamination elements 14 of the body 15 may be different in size, shape and materials as compared to the magnetic lamination elements 30 of the flanges 16. As depicted in FIG. 2, each magnetic lamination element is disposed on the inner surface of the iron shield 12 along a direction parallel to the laminating direction. For example, a surface of one of the magnetic lamination elements 14 and 30 perpendicular to the laminating direction is disposed on the inner surface of the iron shield 12 so as to dispose the respective magnetic lamination elements 14 and 30 on the iron shield 12.

In the illustrated example in FIG. 2, the plurality of the magnetic lamination elements 14 and 30 are deployed on the body 15 and the two flanges 16 along a direction of the static magnetic field generated by the superconducting magnet 11. For example, the plurality of the magnetic lamination elements 14 and 30 are disposed longitudinally on the body 15 and disposed transversely on the flanges 16 along the direction of the static magnetic field respectively. In non-limiting examples, one or more non-magnetic gaps 22 and one or more non-magnetic gaps 31 may be defined between adjacent magnetic lamination elements 14 of the body 15 and between adjacent magnetic lamination elements 30 of the flanges 16 along the direction of the static magnetic field respectively. The gaps 31 on the flanges 16 may be different that the gaps 22 on the body 15. In some examples, the distance for forming the gap 22 and/or the gap 30 may be in a range of 5%-20% of a length of the respective magnetic lamination element along the direction of the static magnetic field. In non-limiting examples, the length of the magnetic lamination element 14 or 30 may be in a range of 5 cm-20 cm.

Figure 3:
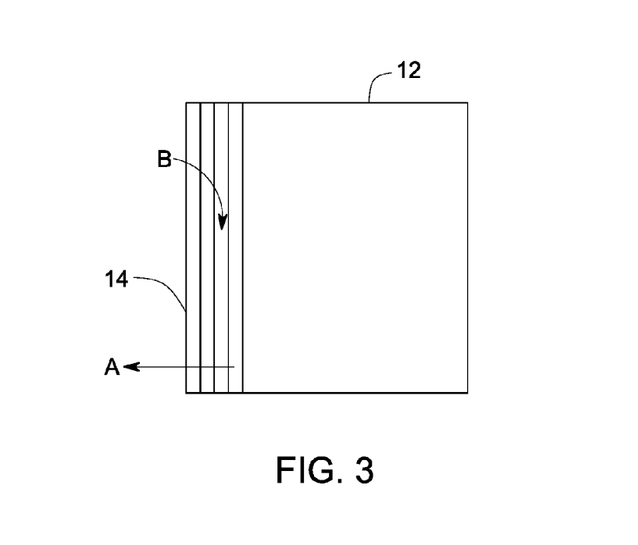
FIG. 3 is a schematic diagram illustrating operation of a magnetic lamination element disposed on an iron shield.

In some embodiments, the magnetic lamination elements 14 and/or 30 may have a higher magnetic permeability along a direction perpendicular to the laminating direction than that along a direction parallel to the laminating direction. As illustrated in FIG. 3, the magnetic lamination element 14 is take as an illustrative example, during operation, due to the existence of the magnetic lamination element 14, when the gradient magnetic field "B" generated by the magnetic gradient coil assembly 13 enters into the magnetic lamination element 14, at least a portion of the gradient magnetic field may be guided by the magnetic lamination element 14 along the direction perpendicular to the laminating direction. As a result, the at least a portion of the gradient magnetic field may be guided away from the iron shield 12 and will not penetrate into the iron shield 12, thereby reducing the magnitude and the time constant of the eddy current induced in the iron shield 12

Additionally, in some examples, the magnetic lamination elements 14 and/or 30 may comprise two or more laminated electrically insulated, layers so as to have higher electrical resistivity than that of the iron shield 12 while the size of each of the magnetic lamination elements 14 and 30 is smaller than that of the iron shield 12. Thus, the magnitude and the time constant of the eddy current induced, in the magnetic lamination elements 14 and/or 30 may be relatively small and may not affect the quality of the images.

Figure 9:
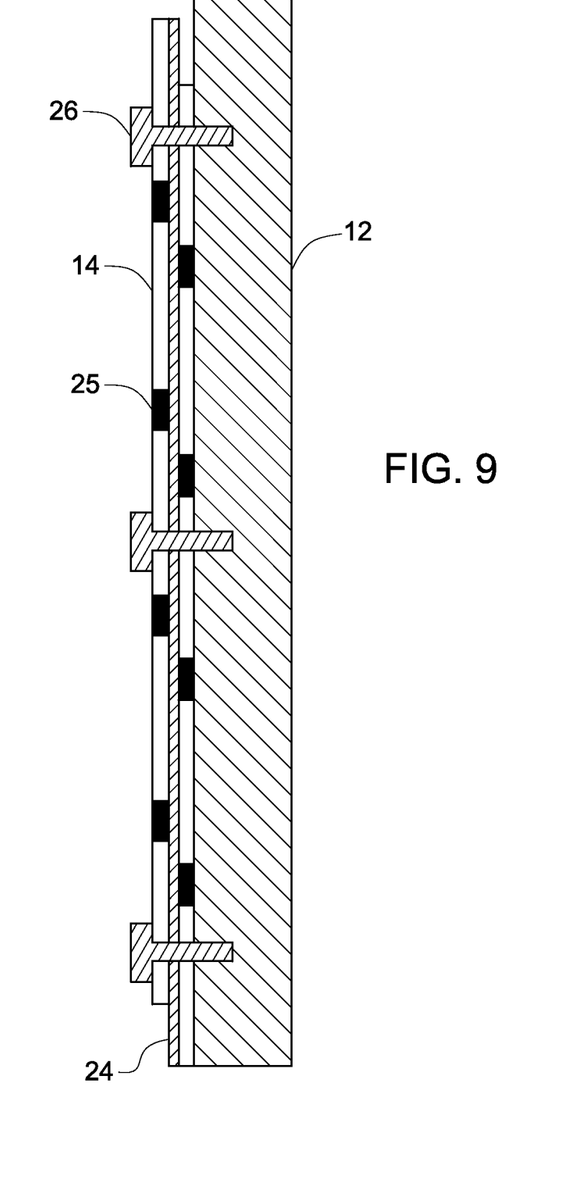
FIG. 9 is a schematic diagram of an assembly of the magnetic lamination elements and the iron shield.

In certain applications, the non-magnetic gaps 22 and 31 along the direction of the static magnetic field may increase the magnetic reluctance between respective adjacent magnetic lamination elements 14 and 30, so that at least a portion of the static magnetic field generated by the superconducting magnet 11 may be guided from the magnetic lamination elements 14 and 30 to the iron shield 12 so as to prevent the magnetic lamination elements from magnetic saturation and improve the capability of the magnetic lamination elements for preventing the gradient magnetic field from penetrating into the iron shield. As a result, the total eddy current induced in the iron shield 12 may be reduced. In certain applications, the non-magnetic gaps 22 and/or 31 may be filled with fiberglass-reinforced plastics (FRP) 25 (as shown in FIG. 9) or other suitable non-magnetic materials. In non-limiting examples, the fiberglass-reinforced plastics may be formed by an impregnating resin such as epoxy resin into fiberglass.

It should be noted that the arrangements in FIG. 2 is mere illustrative. In other applications, at least one magnetic lamination element 14 or 30 may be employed on the iron shield 12, so that the non-magnetic gaps 22 or 31 may not be defined. Additionally, in certain applications, the one or more of the magnetic lamination elements 14 and 30 may be disposed on the inner surface of the iron shield 12 along a direction perpendicular to the laminating direction. For example, a surface of one of the magnetic lamination element 14 or 30 parallel to the laminating direction is disposed on the respective inner surface of the iron shield 12 on as to dispose the corresponding magnetic lamination element 14 or 30 on the iron shield 12. As compared to a superconducting magnet assembly without the one or more of the magnetic lamination elements 14 and 30, the magnitude and the time constant of the eddy current induced in the iron shield may also be reduced.

FIGS. 4-7 are schematic perspective diagrams of deployments of the magnetic lamination elements 14 and 30 on the iron shield 12. As depicted in FIG. 1, the body 15 and each of the flanges 16 comprises a plurality of separate elements such as plates or sections, and the magnetic lamination elements 14 and 30 may be deployed according to the configurations of the body 15 and the flanges 16 respectively.

Figure 4:
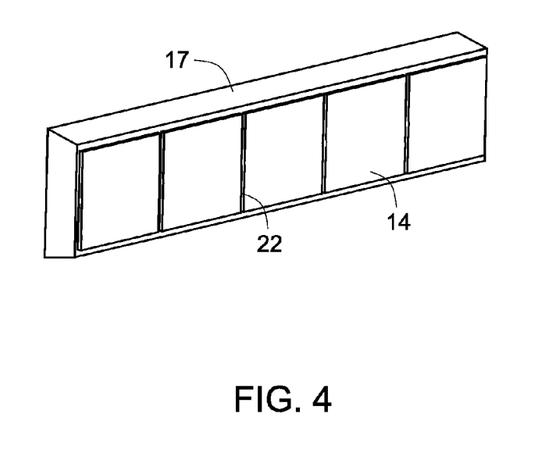
FIGS. 4-7 are schematic perspective diagrams of deployments of the magnetic lamination elements on the iron shield.
Figure 5:
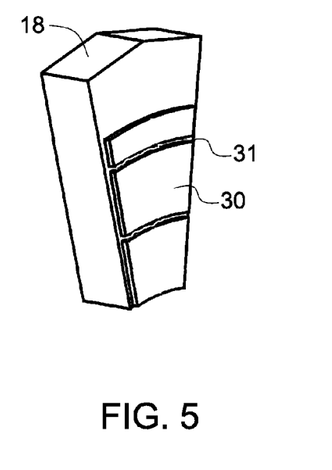

For the illustrated arrangements in FIGS. 4-7, one element of each of the body 15 and the flange 16 is taken for an illustrative example. As illustrated in FIGS. 4 and 5, a column of more than one magnetic lamination element 14 and a column of more than one magnetic lamination element 30 are disposed on the body elements 17 and flange elements 18 respectively along the direction of the static magnetic field with the one or more non-magnetic gaps 22 and the one or more non-magnetic gaps 31 defined between respective adjacent magnetic lamination elements 14 and 30. In other applications, one magnetic lamination element may be employed on each of the elements 17 and 18 in one column.

Figure 6:
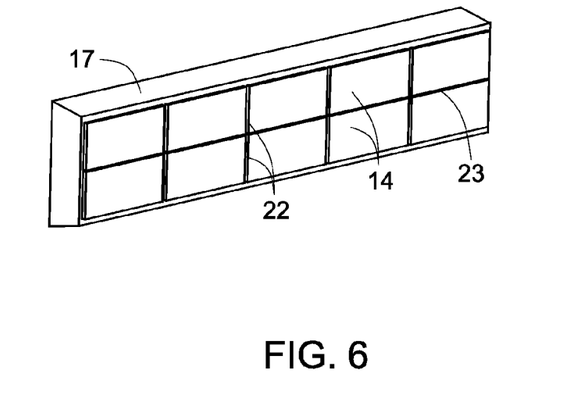
Figure 7:
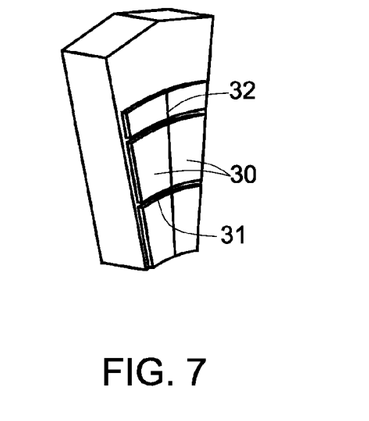

In certain applications, two or more columns of the magnetic lamination elements may be employed on each of the elements 17 and 18. As illustrated in FIGS. 6 and 7, two columns of the magnetic lamination elements are employed and the magnetic lamination elements in each column are disposed on each of the respective elements 17 and 18 along the direction of the static magnetic field with one or more non-magnetic gaps are defined between respective adjacent magnetic lamination elements. Additionally, one or more gaps 2J and one or more gaps 32 may be defined between adjacent magnetic lamination elements in the two respective columns.

It should be noted that the arrangements in FIGS. 4-7 are merely illustrative. In some embodiments, the body 15 and/or each of the flanges 16 may be formed unitary. The one or more magnetic lamination elements 14 may be employed to form a matrix of one or more columns and one or more rows of the one or more magnetic lamination elements. In addition, the one or more magnetic lamination elements 30 may have the similar matrix as the one or more magnetic lamination elements 14.

Figure 8:
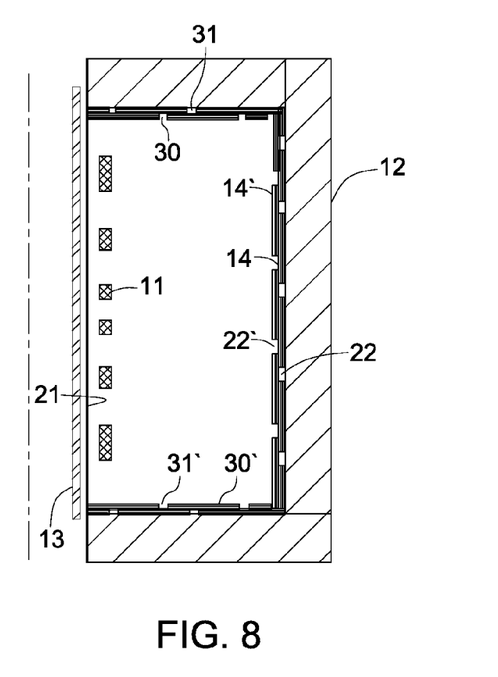
FIG. 8 is a schematic cross-section view of the superconducting magnet assembly in accordance with another embodiment of the system.

FIG. 8 illustrates a schematic cross-section view of the superconducting magnet assembly 10 in accordance with another embodiment of the invention. The arrangement in FIG. 8 is similar to the arrangement in FIG. 2. The two arrangements in FIGS. 2 and 8 differs in that the arrangement in FIG. 8 comprises two or more layers of the magnetic lamination elements in each of the body 15 and the flanges 16 of the iron shield 12. In non-limiting examples, one or more magnetic lamination elements may be employed in one layer.

As illustrated in FIG. 8, a lower layer of the magnetic lamination elements 14 is disposed on the inner surface of the iron shield 12 with one or more non-magnetic gaps 22 defined between adjacent magnetic lamination elements along the direction of the static magnetic field. In this illustrated embodiment, an upper layer of the magnetic lamination elements 14' has the similar configuration with the lower layer of the magnetic lamination elements 14 and is disposed on the lower layer of the magnetic lamination elements 14 in a configuration that at least one of the magnetic lamination elements 14' in the upper layer overlaps or covers the at least one respective non-magnetic gap 22 in the lower layer. The upper layer of magnetic lamination elements 14' have gaps 22' between respective elements. The magnetic lamination elements 14 and 14' may be of similar shape and/or configuration or varied depending upon design criteria. Likewise, the gaps 22 of the lower layer may be the same or different from the gaps 22' on the upper layer.

Similarly, the magnetic lamination elements 30 and magnetic lamination elements 30' are disposed on the flanges 16 in a configuration that the magnetic lamination elements 30' are in an upper layer and the magnetic lamination elements 30 are in a lower layer. The magnetic lamination elements 30 on the lower layer may have the same or different materials, shape and size as compared to magnetic lamination elements 30' on the upper layer. Similarly, the gaps 31 on the lower layer can be the same or different than the gaps 31' on the upper layer.

In certain applications, when more than one layer of the magnetic lamination elements 14, 14' or 30, 30' is employed, as illustrated FIG. 9, a layer of resin-impregnated fiber glass 24 may be provided between adjacent layers. Similarly, the one or more non-magnetic gaps 22, 22', 31, 31' in the respective layers may also be filled with Fiberglass-Reinforced Plastics (FRP) 25 or other suitable non-magnetic materials. The one or more layers of the one or more magnetic lamination elements may be glued via epoxy resins, or be screwed or bolted on the iron shield 12 by bolts 26.

In embodiments of the system, the superconducting magnet assembly may employ one or more layers of one or more magnetic lamination elements. In some applications, one or more non-magnetic gaps may also be defined between adjacent magnetic lamination elements in each layer. Accordingly, due to existence of the one or more spaced magnetic lamination elements on the iron shield, the magnitude and the time constant of the eddy current induced in the iron shield by the magnetic gradient coil assembly may be reduced so as to improve the quality of the images retrieved by the MRI systems.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be through the spirit and scope of the disclosure as defined by the subsequent claims.

What is claimed is:

1. A superconducting magnet assembly, comprising:
    a superconducting magnet configured to generate a static magnetic field;
    an iron shield configured to shield the superconducting magnet;
    a magnetic gradient coil assembly configured to generate a gradient magnetic field; and
    one or more magnetic lamination elements disposed on the iron shield to reduce eddy currents induced by the gradient magnetic field in the iron shield,
    wherein the one or more magnetic lamination elements are disposed on an interior surface of the iron shield in a configuration of one or more layers, at least one of the one or more layers comprising more than one magnetic lamination element,
    wherein one or more non-magnetic gaps are defined between adjacent magnetic lamination elements in the at least one layer,
    wherein the more than one magnetic lamination element in the at least one layer is disposed on the iron shield along a direction of the static magnetic field generated by the superconducting magnet, and
    wherein the one or more non-magnetic gaps are defined along the direction of the static magnetic field.

2. The superconducting magnet assembly of claim 1, wherein the superconducting magnet assembly is used in a magnetic resonance imaging system, and wherein the superconducting magnet comprises one or more superconducting winding coils.

3. The superconducting magnet assembly of claim 1, wherein each of the one or more magnetic lamination elements comprises two or more layers of one or more magnetic materials.

4. The superconducting magnet assembly of claim 3, wherein at least one of the one or more magnetic lamination elements are disposed on the iron shield along a direction parallel to a laminating direction of the at least one of the one or more magnetic lamination elements.

5. The superconducting magnet assembly of claim 3, wherein the one or more magnetic materials comprises silicon steel, amorphous magnetic materials, and combination thereof.

6. The superconducting magnet assembly of claim 1, further comprising one or more fiberglass-reinforced plastics disposed within the respective one or more non-magnetic gaps.

7. The superconducting magnet assembly of claim 1, wherein the one or more magnetic lamination elements are disposed on the iron shield in the configuration of two or more layers, and wherein at least one magnetic lamination element in an upper layer covers at least one of the one or more non-magnetic gaps defined in a lower layer.

8. The superconducting magnet assembly of claim 7, further comprising one or more layers of fiberglass disposed between adjacent layers of the one or more magnetic lamination elements.

9. The superconducting magnet assembly of claim 1, wherein the iron shield encases the superconducting magnet, and wherein the one or more magnetic lamination elements are disposed on inner surface of the iron shield.

10. A superconducting magnet assembly, comprising:
    a superconducting magnet configured to generate a static magnetic field;
    an iron shield configured to shield the superconducting magnet;
    a magnetic gradient coil assembly configured to generate a gradient magnetic field;
    a plurality of magnetic lamination elements disposed on the iron shield; and
    one or more non-magnetic gaps defined between adjacent magnetic lamination elements along a direction of the static magnetic field generated by the superconducting magnet.

11. The superconducting magnet assembly of claim 10, wherein at least one of the plurality of the magnetic lamination elements are disposed on the iron shield along a direction parallel to a laminating direction of the at least one of the plurality of magnetic lamination elements.

12. The superconducting magnet assembly of claim 10, wherein the plurality of the magnetic lamination elements are disposed on the iron shield in a configuration of two or more layers, and wherein at least one magnetic lamination element in an upper layer covers at least one of the one or more non-magnetic gaps defined in a lower layer.

13. A superconducting magnet assembly, comprising:
    a superconducting magnet configured to generate a static magnetic field;
    an iron shield configured to shield the superconducting magnet;
    a magnetic gradient coil assembly configured to generate a gradient magnetic field; and one or more magnetic lamination elements disposed on the iron shield to reduce eddy currents induced by the gradient magnetic field in the iron shield;

wherein (i) at least one of the one or more magnetic lamination elements are disposed on the iron shield along a direction parallel to a laminating direction of the at least one of the one or more magnetic lamination elements; (ii) the one or more magnetic lamination elements are disposed on an interior surface of the iron shield in a configuration of one or more layers, wherein at least one of the one or more layers comprises more than one magnetic lamination element and one or more non-magnetic gaps are defined between adjacent magnetic lamination elements in the at least one layer; and (iii) the one or more magnetic lamination elements further comprises one or more layers of fiberglass disposed between adjacent layers of the one or more magnetic lamination elements.

* * * * *

UNITED STATES PATENT AND TRADEMARK OFFICE
CERTIFICATE OF CORRECTION

| | | |
|---|---|---|
| PATENT NO. | : 8,487,727 B2 | Page 1 of 1 |
| APPLICATION NO. | : 13/218517 | |
| DATED | : July 16, 2013 | |
| INVENTOR(S) | : Wu et al. | |

It is certified that error appears in the above-identified patent and that said Letters Patent is hereby corrected as shown below:

In the Specification

In Column 2, Line 47, delete "imaging" and insert -- Imaging --, therefor.

In Column 2, Line 49, delete "illustrated," and insert -- illustrated --, therefor.

In Column 3, Line 58, delete "liquid," and insert -- liquid --, therefor.

In Column 5, Line 22, delete "shield 12" and insert -- shield 12. --, therefor.

In Column 5, Line 25, delete "insulated," and insert -- insulated --, therefor.

In Column 5, Line 29, delete "induced," and insert -- induced --, therefor.

In Column 5, Line 59, delete "on as" and insert -- so as --, therefor.

In Column 6, Line 26, delete "2J" and insert -- 23 --, therefor.

In Column 7, Line 11, delete "illustrated" and insert -- illustrated in --, therefor.

Signed and Sealed this
Twenty-second Day of October, 2013

Teresa Stanek Rea
*Deputy Director of the United States Patent and Trademark Office*